United States Patent
Chen et al.

(10) Patent No.: US 12,012,669 B2
(45) Date of Patent: Jun. 18, 2024

(54) METHOD OF PROCESSING A LITHIUM TANTALATE AND/OR LITHIUM NIOBATE WAFER BY SUBJECTING THE WAFER TO HEAT AND A REDUCING AGENT

(71) Applicant: FUJIAN JING' AN OPTOELECTRONICS CO., LTD., Quanzhou (CN)

(72) Inventors: Mingxin Chen, Quanzhou (CN); Xuewu Wang, Quanzhou (CN)

(73) Assignee: Fujian Jing' An Optoelectronics Co., LTD., Quanzhou (CN)

( * ) Notice: Subject to any disclaimer, the term of this patent is extended or adjusted under 35 U.S.C. 154(b) by 773 days.

(21) Appl. No.: 16/941,095

(22) Filed: Jul. 28, 2020

(65) Prior Publication Data
US 2020/0354855 A1 Nov. 12, 2020

Related U.S. Application Data
(63) Continuation-in-part of application No. PCT/CN2019/072020, filed on Jan. 16, 2019.

(30) Foreign Application Priority Data
Feb. 2, 2018 (CN) .......................... 201810108099.5

(51) Int. Cl.
*C30B 29/30* (2006.01)
*C30B 33/02* (2006.01)
(Continued)

(52) U.S. Cl.
CPC .............. *C30B 29/30* (2013.01); *C30B 33/02* (2013.01); *H01L 21/02664* (2013.01); *H03H 9/14502* (2013.01)

(58) Field of Classification Search
CPC ... C30B 29/30; C30B 33/02; H01L 21/02664; H03H 9/14502; H03H 3/08; H03H 9/02559; G02F 1/0018; G02F 1/03; H10N 30/01; H10N 30/85
See application file for complete search history.

(56) References Cited

U.S. PATENT DOCUMENTS

2004/0222273 A1* 11/2004 Galambos ......... H01L 21/67313
228/219

FOREIGN PATENT DOCUMENTS

| CN | 1621578 A | * | 6/2005 | ............. C30C 29/30 |
| CN | 1754014 A | | 3/2006 | |

(Continued)

OTHER PUBLICATIONS

Search Report appended to an Office Action, which was issued to Chinese counterpart application No. 201810108099.5 by the CNIPA on Sep. 14, 2020 with an English translation thereof.
(Continued)

*Primary Examiner* — Ermias T Woldegeorgis
(74) *Attorney, Agent, or Firm* — Saint Island International Patent & Law Offices

(57) ABSTRACT

A method for processing a wafer includes subjecting the wafer to a reduction treatment with heat and a reducing agent that has a melting point of lower than 600° C. The wafer is made of a material selected from the group consisting of lithium tantalate, lithium niobate, and a combination thereof. The wafer and the reducing agent are spaced apart from each other so that the reducing agent indirectly interacts with the wafer during the reduction treatment. Also disclosed is a processed wafer obtained by the method.

15 Claims, 2 Drawing Sheets

(51) Int. Cl.
    *H01L 21/02*     (2006.01)
    *H03H 9/145*     (2006.01)

(56) References Cited

FOREIGN PATENT DOCUMENTS

| | | | | |
|---|---|---|---|---|
| CN | 1950549 | A | | 4/2007 |
| CN | 106544735 | A | * | 3/2017 |
| CN | 106591951 | A | | 4/2017 |
| CN | 106929916 | A | * | 7/2017 |
| CN | 106929916 | A | | 7/2017 |
| CN | 107099847 | A | | 8/2017 |
| JP | 2010173864 | A | * | 8/2010 |
| WO | WO-2004079061 | A1 | * | 9/2004 ............. C30B 29/30 |

OTHER PUBLICATIONS

Search Report issued to PCT application No. PCT/CN2019/072020 by the WIPO on Apr. 8, 2019.
Search Report appended to an Office Action, which was issued to Chinese counterpart application No. 201810108099.5 by the CNIPA on Mar. 26, 2021, with an English translation thereof.
He, Jingwen, "Drug Synthesis (for Pharmacy, Pharmaceuticals, and Relevant Fields)", Teaching Material of Advanced Vocational Education "125", China Light Industry Press, 2013, p. 209.
Hsu, Fuming et al., "The Application of Energizing Explosive and Gunpowder in Industry and Agriculture—Gas Generating Agent and Gas Generator", Defense Industry Press, 1988, p. 165.

* cited by examiner

METHOD OF PROCESSING A LITHIUM TANTALATE AND/OR LITHIUM NIOBATE WAFER BY SUBJECTING THE WAFER TO HEAT AND A REDUCING AGENT

CROSS-REFERENCE TO RELATED APPLICATION

This application is a continuation-in-part application of PCT International Application No. PCT/CN2019/072020 filed on Jan. 16, 2019, which claims priority of Chinese Invention Patent Application No. 201810108099.5, filed on Feb. 2, 2018. The entire content of each of the international and Chinese patent applications is incorporated herein by reference.

FIELD

The present disclosure relates to a wafer processing method and a processed wafer obtained thereby.

BACKGROUND

Crystals of lithium tantalate ($LiTaO_3$) and lithium niobate ($LiNbO_3$) possess excellent piezoelectric, ferroelectric, acousto-optic, and electro-optic properties, and thus, are conventionally used as a basic material in the field of optical communication, laser, and optoelectronics. Furthermore, such crystals are widely used for manufacturing different types of surface acoustic wave (SAW) signal processing devices that function as oscillators, wave filters, transducers, etc. Due to their good electromechanical coupling, temperature coefficient, and other comprehensive properties, the aforesaid crystals are particularly utilized for manufacturing high-frequency SAW devices which are applicable in various high-end communication technologies, such as those for mobile phones, walkie-talkies, satellites, aircrafts, spacecrafts, etc. At present, considering high-frequency SAW devices satisfying 2.5G and 3G telecommunications technology standards, there are no other materials superior to $LiTaO_3$ and $LiNbO_3$ crystals.

In the manufacturing of SAW devices, $LiTaO_3$ and $LiNbO_3$ crystals are first subjected to several processing steps, such as cutting, grinding, polishing, etc., to obtain $LiTaO_3$ and $LiNbO_3$ wafers, and then metallic electrodes in a comb-shaped arrangement (e.g., interdigital electrodes) are formed on the surface of the wafers via sputter deposition, photolithography, and/or other techniques. However, for SAW devices to be operated at a higher frequency, the metallic electrodes are required to be made thinner and finer, thus incurring the problems of reduced manufacturing yield and higher manufacturing cost, which are described below.

First, since the $LiTaO_3$ and $LiNbO_3$ crystals have a high pyroelectric coefficient ($23 \times 10^{-5}$ C/(m2·K)) and an extremely high resistivity (1013 Ωcm to 1015 Ωcm), during manufacturing of a SAW device such as a wave filter, a change in temperature would cause a large amount of electrostatic charges to be easily accumulated on the surface of $LiTaO_3$ and $LiNbO_3$ wafers, and these electrostatic charges would be released among the metallic interdigital electrodes or the $LiTaO_3$ or $LiNbO_3$ wafers, therefore creating problems such as cracking of the $LiTaO_3$ or $LiNbO_3$ wafers or burning of metallic interdigital electrodes.

Second, $LiTaO_3$ and $LiNbO_3$ wafers have a high light transmittance, such that when the wave filter is subjected to a photolithography process during manufacturing thereof, a light transmitted through the $LiTaO_3$ and $LiNbO_3$ wafers would be reflected on a back surface thereof and then return to a front surface thereof, causing a decrease in the resolution of the thus formed pattern on the $LiTaO_3$ and $LiNbO_3$ wafers.

In order to resolve the aforesaid problems, the $LiTaO_3$ and $LiNbO_3$ wafers may be subjected to a reduction treatment to reduce the resistivity thereof. During such reduction treatment, the $LiTaO_3$ and $LiNbO_3$ wafers change from colorless or transparently pale yellow to opaquely colored (normally grey or brownish black). Thus, the reduction treatment is referred to as blackening. The opaquely colored $LiTaO_3$ and $LiNbO_3$ wafers have lowered light transmittance, such that the surface thereof to be patterned may have an improved pattern resolution.

CN 100424235 discloses a method for producing a $LiTaO_3$ wafer, in which a crystal or metallic substrate containing $LiTaO_3$, $LiNbO_3$ or hydrogen storage metals is first subjected to a first reduction treatment that is performed in a reducing atmosphere of a circulating gas; or an inert gas so as to obtain a reduced crystal or metallic substrate, which is then stacked on a $LiTaO_3$ or $LiNbO_3$ wafer to be further subjected to a second reduction treatment at a temperature lower than that of the first reduction treatment. The method of CN 100424235 involves complex steps, i.e., subjecting the crystal or metallic substrate (which might be costly) to the first reduction treatment under a Curie temperature or higher, grinding the $LiTaO_3$ or $LiNbO_3$ wafer to confer a high degree of flatness for ensuring its close contact with the reduced crystal or metallic substrate, and conducting the second reduction treatment under a reducing atmosphere. Thus, the method of CN 100424235 requires a long time period with a high manufacturing cost.

CN 1324167 discloses a process for manufacturing a $LiTaO_3$ substrate, wherein an ingot form of a $LiTaO_3$ crystal, which is embedded in carbon or silicon powders, or which is placed in a carbon or silicon vessel, is subjected to a heat treatment. Such patent further discloses subjecting a wafer form of $LiTaO_3$ crystal, which is buried in metal powders of calcium, aluminum, titanium, zinc, or silicon, to a heat treatment. However, strong reduction conferred by such metal elements causes the $LiTaO_3$ crystal to be easily over-oxidized or the piezoelectricity thereof to be adversely affected. Moreover, CN 1003418785 discloses burying a $LiTaO_3$ crystal in a mixed powder of aluminum and aluminum oxide, followed by subjecting the $LiTaO_3$ crystal to a reduction treatment that is performed in a reduced-pressure atmosphere of a gas such as nitrogen, argon, etc., so as to obtain a reduced $LiTaO_3$ substrate that is colored and opaque. However, it remains difficult to accurately adjust the ratio of aluminum and aluminum oxide and to control the uniformity of the resultant mixed powder, and preparation of the mixed powder might have an adverse effect on occupational safety and health.

SUMMARY

Therefore, an object of the present disclosure is to provide a method for processing a wafer that can alleviate at least one of the drawbacks of the prior art.

The method for processing a wafer includes subjecting the wafer to a reduction treatment with heat and a reducing agent that has a melting point of lower than 600° C. The wafer is made of a material selected from the group consisting of lithium tantalate, lithium niobate, and a combination thereof. The wafer and the reducing agent are spaced apart from each other so that the reducing agent indirectly interacts with the wafer during the reduction treatment.

Another object of the present disclosure is to provide a processed wafer that can alleviate at least one of the drawbacks of the prior art.

The processed wafer is obtained by the abovementioned method, and has a transmittance uniformity of less than 15% for an incident light having a wavelength ranging from 300 nm to 900 nm.

BRIEF DESCRIPTION OF THE DRAWINGS

Other features and advantages or the present disclosure will become apparent in the following detailed description of the embodiments with reference to the accompanying drawings, of which.

DETAILED DESCRIPTION

Figure 1:
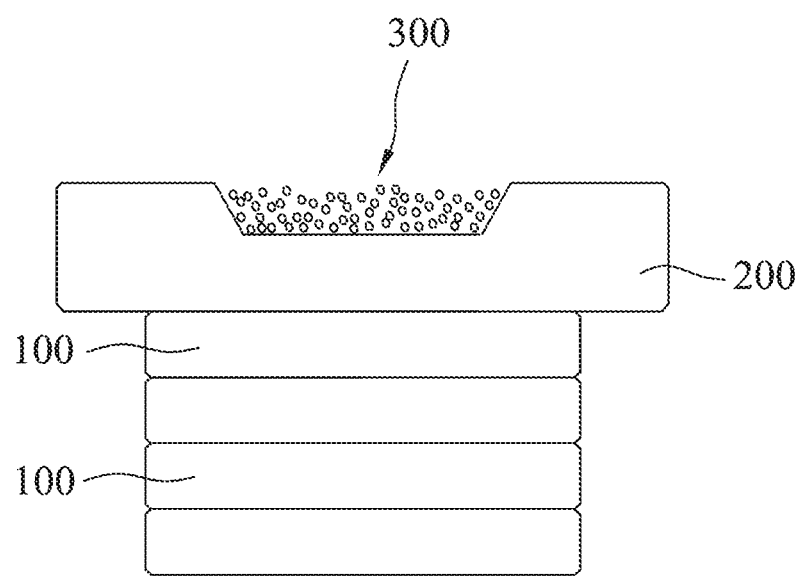
FIG. 1 is a schematic view illustrating a first embodiment of a wafer processing method according to the present disclosure.

Before the present disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a first embodiment of a wafer processing method includes subjecting a plurality of wafers 100 to a reduction treatment with heat and a reducing agent 300 that has a melting point of lower than 600° C.

Exemplary materials suitable for making the wafers 100 may include, but are not limited to, lithium tantalate, lithium niobate, and a combination thereof.

In this embodiment, the wafers 100 are stacked one upon another, and a pressure block 200 and the reducing agent 300 are sequentially disposed on the top one of the wafers 100 in such order. The wafers 100 are subjected to the reduction treatment in a reaction chamber (not shown). The wafers 100 and the reducing agent 300 are spaced apart from each other by the pressure block 200, so that the reducing agent 300 indirectly interacts with the wafer 100 during the reduction treatment. The pressure block 200 also serves to prevent the wafers 100 from misalignment from one another, based on the gravity.

Examples of the reducing agent 300 may include, but are not limited to, magnesium, wood pulp, cotton pulp, straw pulp, chitin, proteins, olefins, aromatics, carbohydrates, and combinations thereof. Examples of the carbohydrates may include, but are not limited to, starch and sugar. The reducing agent 300 may be in a form that may include powder, a sheet, a strip, and combinations thereof. In this embodiment, the reducing agent 300 is in a form of powder. In a variation of the first embodiment, the reducing agent 300 may be in a form of a sheet that has a thickness ranging from 1 mm to 10 mm (see FIG. 2). In another variation of the first embodiment, the reducing agent 300 may be in a form of a strip.

The reduction treatment may be conducted at a temperature that is lower than a Curie temperature of the wafers 100 (for example, 603° C.) In this embodiment, the reduction treatment is conducted at a temperature that ranges from 350° C. to 600° C. It should be noted that, when the reduction treatment is conducted at a temperature that greater than 600° C., the pieoelectricity properties of the wafers 100 might be adversely affected.

During the reduction treatment, the reducing agent 300 undergoes carbonization or vaporization to generate a reducing gas which indirectly interacts with the wafers 100 so as to reduce the same. In other words, the reducing agent 300 in a carbonized or vaporized form (i.e., the reducing gas) is able to diffuse around the pressure block 200 spacing the reducing agent 300 and the wafers 100 apart, so as to act on the wafers 100. In this embodiment, during the reduction treatment, the reducing agent 300 is converted into a gas form which diffuses throughout the wafer 100 to reduce the same. The reduction treatment may be conducted in the presence of a reducing gas or an inert gas having a flow rate that ranges from 0.5 L/min to 3 L/min. Examples of the reducing gas may include, but are not limited to, hydrogen, carbon monoxide, nitrous oxide, and combinations thereof. Examples of the inert gas may include, but are not limited to, nitrogen, neon, argon, carbon dioxide, and combinations thereof. The atmosphere, where the reduction treatment is conducted, may be oxygen-free.

It should be noted that, the pressure block 200 may be dispensed with in other embodiments as long as the wafer(s) 100 and the reducing agent 300 can be spaced apart for the indirect interaction therewith to proceed during the reduction treatment.

The merit of the wafer processing method of present disclosure is described below.

In a conventional wafer processing method (such as that of CN 100424235 and CN 1324167 mentioned before), a reducing agent is brought into contact with a wafer so as to directly interact with the wafer during a reduction treatment with heat. However, since the reducing agent changes its shape and form due to the heat, an interface between the reducing agent and the wafer will become uneven, rendering the reduction (i.e. blackening) of the wafer 100 non-uniform. In addition, since the reducing agent is usually opaque, the single wafer or a plurality of the wafers stacked one upon another, when brought into contact with the reducing agent, might be misaligned with the reducing agent. Thus, during the reduction treatment, the wafer(s) might be unevenly reduced (i.e. unevenly blackened) and have a color difference.

In the wafer processing method of the present disclosure, the reducing agent 300 is not required to be brought in contact with the wafer(s) 100. Moreover, by virtue of the indirect interaction of the reducing agent 300 with the wafer(s) 100, the wafer(s) 100 can be more evenly reduced (i.e. more evenly blackened). More merits of the wafer processing method of the present disclosure are described later.

Figure 2:
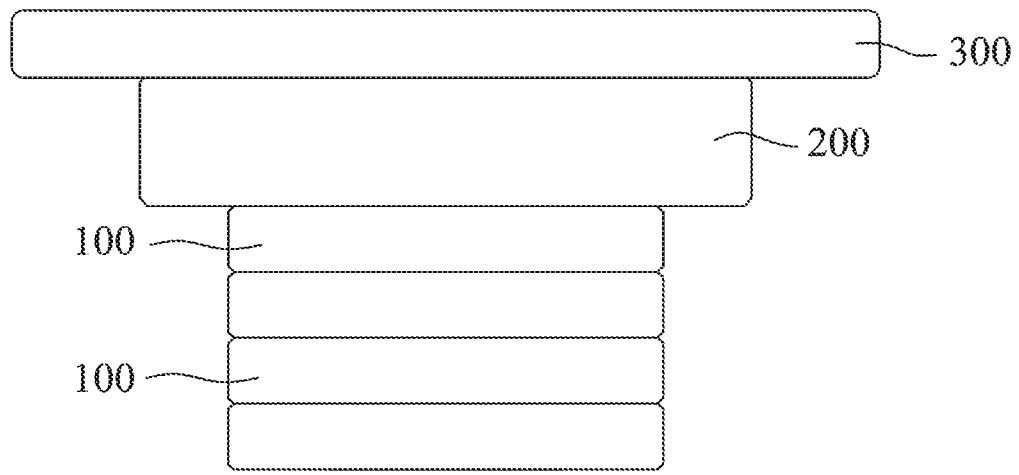
FIG. 2 is a schematic view illustrating a variation of the first embodiment.
Figure 3:
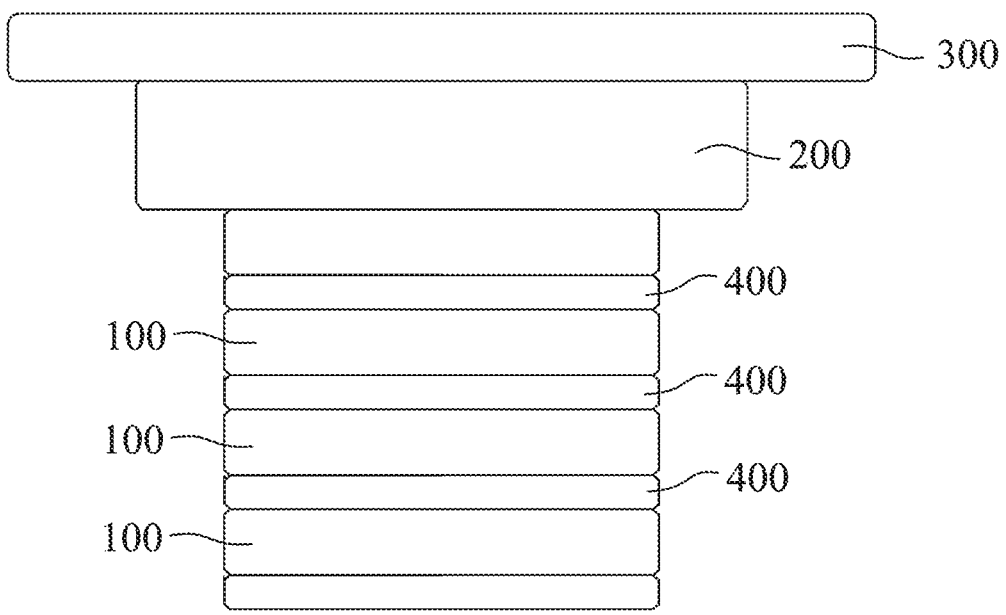
FIG. 3 is a schematic view illustrating a second embodiment of the wafer processing method according to the present disclosure.

Referring to FIG. 3, a second embodiment of the wafer processing method of the present disclosure is generally similar to the variation of the first embodiment shown in FIG. 2, except for the following difference.

Four reduced materials 400 having a size similar to that of the wafers 100 are provided. Each of the three of the reduced materials 400 is interposed between two adjacent ones of the wafers 100, and one of the reduced materials 400 is disposed on the lowermost one of the wafers 100. The reduced materials 400 have been subjected to reduction to a suitable extent, and hence intend to undergo oxidation and are in an unstable state, thereby being able to facilitate the reduction of the wafers 100 and increase the reaction rate of the reduction treatment. Examples of the reduced materials 400 may include, but are not limited to, a ceramic material, a metallic material, and a combination thereof.

The processed wafers obtained by the abovementioned method have been subjected to color determination for analyzing the degree of reduction (blackening). Specifically, the L value (i.e., degree of lightness from black (0) to white (100)) of the processed wafers has been measured using a spectrophotometer according to CIELAB color space. The L value of the processed wafers of the present disclosure ranges from 55 to 66, as compared to the L value of wafers obtained by conventional wafer processing methods which ranges from 66 to 70, indicating that the processed wafers of the present disclosure can be 15% blacker (i.e., reduced degree of lightness). In addition, the processed wafers of the present disclosure have a transmittance uniformity (i.e., {[maximum transmittance value−minimum transmittance value]/[maximum transmittance value+minimum transmittance value]}×100%) of less than 15% for an incident light having a wavelength that ranges from 300 nm to 900 nm. Moreover, the processed wafers of the present disclosure have a transmittance rate of less than 50% for an incident light having a wavelength ranging from 300 nm to 600 nm. With regard to a photolithography process for patterning a wafer, the shorter the wavelength of an exposure light, the lower the transmittance rate of the exposure light to the wafer. However, use of a photolithography device which emits an exposure light having a short wavelength incurs a high cost, and thus, a low transmittance rate of an exposure light to a wafer can eliminate the need of an exposure light having a short wavelength, thereby reducing the cost of the photolithography process.

In summary, by having the wafers 100 (made of lithium tantalate and/or lithium niobate) and the reducing agent 300 spaced apart from each other (e.g., within a distance of 1 m) for the reducing agent 300 to indirectly interact with the wafers 100 curing the reduction treatment, the method of the present disclosure enables the thus obtained processed wafer to have a low transmittance rate of incident light, low resistivity, less pyroelectric effect, an increased electrical conductivity, and a uniform degree of lightness, without adversely affecting the piezoelectricity thereof. Furthermore, the method of the present disclosure is convenient. Thus, when the processed wafer of the present disclosure is utilized for manufacturing surface acoustic wave (SAW) devices, the yield of such devices can be greatly improved with a low manufacturing cost.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but intended to cover various arrangements included within the spirit and scope of the broadest interpretation so as to encompass all such modifications and equivalent arrangements.

What is claimed is:

1. A method for processing a wafer, comprising subjecting the wafer to a reduction treatment with heat and a reducing agent that has a melting point of lower than 600° C.,
    wherein the wafer is made of a material selected from the group consisting of lithium tantalate, lithium niobate, and a combination thereof,
    wherein the wafer and the reducing agent are spaced apart from each other so that the reducing agent indirectly interacts with the wafer during the reduction treatment, and
    wherein the reducing agent is selected from the group consisting of wood pulp, cotton pulp, straw pulp, chitin, a protein, an olefin, an aromatic, a carbohydrate, and any combination thereof.

2. The method as claimed in claim 1, wherein the reduction treatment is conducted in the presence of a gas selected from the group consisting of a reducing gas and an inert gas.

3. The method as claimed in claim 2, wherein the gas has a flow rate that ranges from 0.5 L/min to 3 L/min.

4. The method as claimed in claim 2, wherein the reducing gas is selected from the group consisting of hydrogen, carbon monoxide, nitrous oxide, and combinations thereof.

5. The method as claimed in claim 2, wherein the inert gas is selected from the group consisting of nitrogen, neon, argon, carbon dioxide, and combinations thereof.

6. The method as claimed in claim 1, wherein a plurality of the wafers are stacked one upon another.

7. The method as claimed in claim 6, wherein a reduced material is interposed between two adjacent ones of the wafers.

8. The method as claimed in claim 7, wherein the reduced material is selected from the group consisting of a ceramic material, a metallic material, and a combination thereof.

9. The method as claimed in claim 1, wherein the reducing agent is in a form selected from the group consisting of powder, a sheet, a strip, and combinations thereof.

10. The method as claimed in claim 9, wherein the reducing agent in the form of a sheet has a thickness that ranges from 1 mm to 10 mm.

11. A processed wafer obtained by a method as claimed in claim 1, which has a transmittance uniformity of less than 15% for an incident light having a wavelength ranging from 300 nm to 900 nm.

12. The processed wafer as claimed in claim 11, which has a transmittance rate of less than 50% for an incident light having a wavelength ranging from 300 nm to 600 nm.

13. The method as claimed in claim 1, wherein the reducing agent undergoes one of carbonization and vaporization to indirectly interact with the wafer during the reduction treatment.

14. The method as claimed in claim 1, wherein the reduction treatment is conducted at a temperature that is lower than a Curie temperature of the wafer.

15. The method as claimed in claim 1, wherein the reduction treatment is conducted at a temperature that ranges from 350° C. to 600° C.

* * * * *